United States Patent [19]

Williams

[11] 4,394,643

[45] Jul. 19, 1983

[54] CAPACITIVE TOUCH PANEL CONTROL

[75] Inventor: Robert R. Williams, Green Camp Township, Marion County, Ohio

[73] Assignee: Whirlpool Corporation, Benton Harbor, Mich.

[21] Appl. No.: 258,589

[22] Filed: Apr. 29, 1981

[51] Int. Cl.³ .......................... G06F 3/02; H01G 7/00
[52] U.S. Cl. .......................... 340/365 C; 340/365 A; 200/DIG. 1; 361/283; 400/479.1
[58] Field of Search ........... 340/365 C, 365 R, 365 A, 340/365 S; 200/DIG. 1, 52 R; 400/479, 479.1; 361/288, 290, 283, 280, 281; 179/90 K; 178/17 C

[56] References Cited

U.S. PATENT DOCUMENTS

| | | | |
|---|---|---|---|
| 3,921,167 | 11/1975 | Fox | 340/365 C |
| 3,974,472 | 8/1976 | Gould, Jr. | 200/DIG. 1 |
| 4,013,835 | 3/1977 | Eachus et al. | 340/365 A |
| 4,055,735 | 10/1977 | Eachus et al. | 340/365 C |
| 4,056,699 | 11/1977 | Jordan | 200/DIG. 1 |
| 4,145,584 | 3/1979 | Otterlei | 200/5 A |
| 4,161,766 | 7/1979 | Castleberry et al. | 200/DIG. 1 |
| 4,221,975 | 9/1980 | Ledniczki et al. | 340/365 C |
| 4,290,052 | 9/1981 | Eichelberger et al. | 200/DIG. 1 |
| 4,290,061 | 9/1981 | Serrano | 340/365 C |

OTHER PUBLICATIONS

"Interchangeable Keyboard Components" IBM Technical Disclosure Bulletin, vol. 21, No. 9, Feb. 1979, pp. 3701-3702.

Primary Examiner—Donnie Lee Crosland
Attorney, Agent, or Firm—Wood, Dalton, Phillips, Mason & Rowe

[57] ABSTRACT

A capacitive touch panel control provided with first and second conductive circuit pads on opposite faces of a thin dielectric sheet in the form of a film secured to a dielectric panel by adhesive. The panel is provided with a touch pad. The circuit pads are disposed so that at least a portion of each is in appositional facial registration with the touch pad and out of appositional facial registration with each other so as to provide a variable capacitance between the circuit pads as an incident of selective touching and non-touching of the touch pad by a user. The circuit pads may form a portion of a printed circuit on the film which further includes electrical conductors for making connection to associated apparatus. Ground conductors may be provided on the film adjacent the output voltage conductors of the circuit to reduce leakage between the circuit conductors. The provision of the circuit pads on opposite faces of the film permits electrically insulated crossover of the conductors for facilitated layout of the circuit.

15 Claims, 4 Drawing Figures

U.S. Patent   Jul. 19, 1983   4,394,643
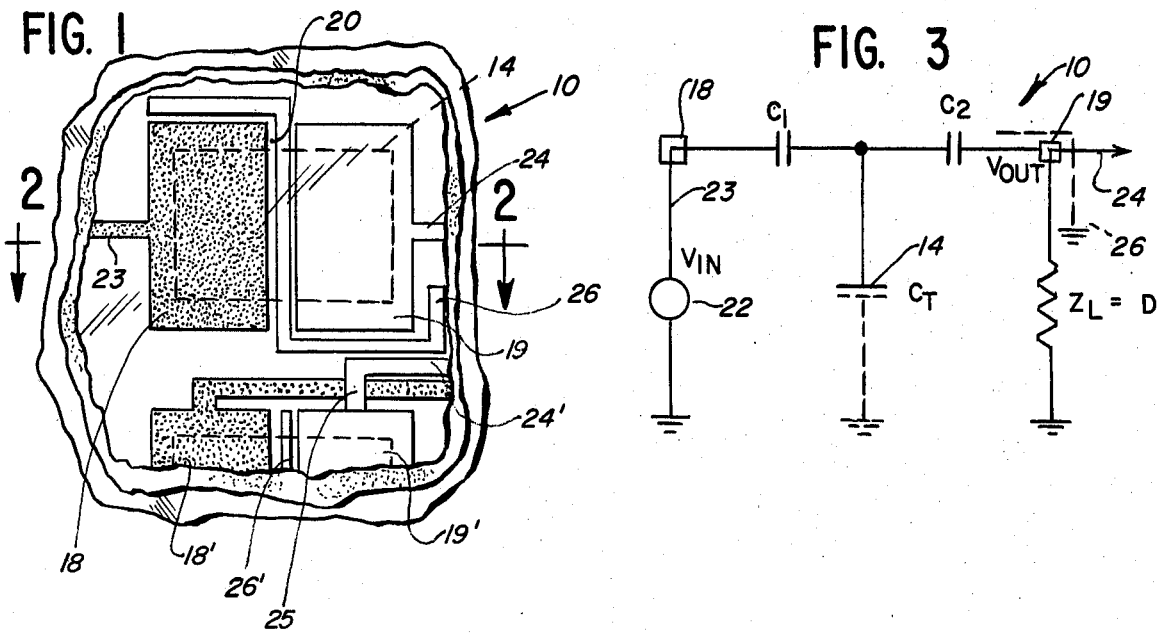
FIG. 1
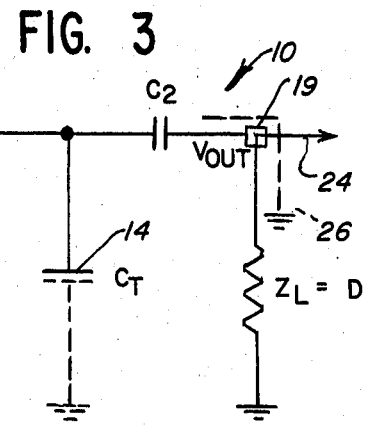
FIG. 3
FIG. 2
FIG. 4 PRIOR ART
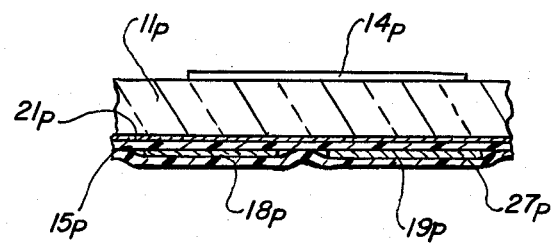

CAPACITIVE TOUCH PANEL CONTROL

BACKGROUND OF THE INVENTION

1. Field of the Invention

This invention relates to electrical control circuits and in particular to capacitive touch panel control circuits.

2. Description of the Background Art

In one form of conventional touch control illustrated in U.S. Pat. No. 3,974,472 of Robert R. Gould, Jr. a conductive pad is provided on the user's side of a glass panel. On the rear of the panel, additional conductive pads are associated with the conductive pad on the user's side. An oscillator and a level detector are connected to the conductive pads on the rear of the panel with the circuit arranged so that when the conductive pad on the user's side is untouched, the level detector provides a high or logic one level output. When the conductive pad on the user's side is touched, additional capacitance is introduced into the circuit between ground and the junction between the two capacitors formed by the conductive pads so as to attenuate the input to the level detector to produce a lower logic level zero output from the detector.

Leslie S. Jordan shows, in U.S. Pat. No. 4,056,699, a generally similar touch plate wherein the rear surface of the glass panel is provided with a nonconductive coating.

In U.S. Pat. No. 4,013,835 of Joseph J. Eachus et al, the touch sensitive device includes a printed circuit board arrangement of conductors which define the data input locations that are touch sensitive. A layer of variable resistance material is disposed over the printed circuit board which is highly conductive when subjected to touch pressure.

A somewhat similar structure is illustrated in U.S. Pat. No. 4,055,735 of Joseph J. Eachus et al.

John L. Otterlei, in U.S. Pat. No. 4,145,584, illustrates the use of indicia on a painted layer on the surface of a metal laminae which is spaced from keyboard components by ridges in an insulating layer.

In U.S. Pat. No. 4,161,766, Donald E. Castleberry et al disclose a laminated capacitive touch-pad having a thin film touch-plate electrode deposited upon a first surface of a first relatively thin dielectric layer and having spaced transmitter and receiver electrodes deposited upon a second surface of the first layer within the outline of and opposite to the touch electrode. A relatively thick backing layer of dielectric material is laminated upon the second surface to provide a total thickness as measured between the furthest opposed surfaces of the first and second layers, as required for high voltage insulation purposes. The patentees teach that the touch, transmitter and receiver electrodes may be of thin film construction.

Ferenc Ledniczki et al, in U.S. Pat. No. 4,221,975, show a touch activated controller for generating up and down control signals in response to movement of a person's finger along a control surface thereof.

SUMMARY OF THE INVENTION

The present invention comprehends an improved capacitive touch panel control wherein the conductive circuit pads are provided on opposite surfaces of a wall member retained in facial juxtaposition to a first wall member on which the touch pad is provided.

The invention comprehends the provision of the conductive circuit pads as printed circuit means on a synthetic resin film.

The invention comprehends retaining the printed circuit film in facial juxtaposition to the wall member on which the touch pad is carried by adhesive means.

As a result of disposing the conductive circuit pads on opposite surfaces of the dielectric film, an improved capacitive touch panel circuit is provided.

The provision of the circuit pads on opposite surfaces of the film permits facilitated crossover of conductors extending from the circuit pads.

The invention comprehends the provision of grounding conductors adjacent the output conductors for improved prevention of leakage between the output conductors.

In the illustrated embodiment, the input circuit pad is disposed on the surface of the film adjacent the wall member carrying the touch pad so as to effectively maximize the overall change in voltage between the touched and untouched states of the touch pad.

The capacitive touch panel circuit of the present invention is extremely simple and economical of construction while yet providing the highly desirable features discussed above.

BRIEF DESCRIPTION OF THE DRAWING

Other features and advantages of the invention will be apparent from the following description taken in connection with the accompanying drawing wherein:

FIG. 1 is a fragmentary bottom plan view of a capacitive touch panel circuit structure embodying the invention;

FIG. 2 is a fragmentary vertical section taken substantially along the line 2—2 of FIG. 1 illustrating the different capacitances of the arrangement when a user is touching the touch pad;

FIG. 3 is a schematic wiring diagram illustrating the control circuitry; and

FIG. 4 is a fragmentary vertical section illustrating the construction of a prior art device.

DESCRIPTION OF THE PREFERRED EMBODIMENT

In the exemplary embodiment of the invention as disclosed in FIGS. 1 and 2, a capacitive touch panel control generally designated 10 is shown to comprise a first dielectric wall member 11 having a first surface 12 and an opposite second surface 13. In the illustrated embodiment, the first wall member comprises a glass panel.

A conductive touch pad 14 is provided on first surface 12 of the wall member 11 for engagement by a user's finger F in the use of the control 10, as illustrated in FIG. 2.

Control 10 further includes a second dielectric wall member 15 having a third surface 16 and an opposite, fourth surface 17.

A first conductive circuit pad 18 is provided on surface 16 and a second conductive circuit pad 19 is provided on surface 17.

As shown in FIG. 1, pad 19 is out of appositional facial registration with the first circuit pad and effectively defines a space 20 extending between the circuit pads and through the second wall member 15, as best illustrated in FIG. 1.

Means are provided for retaining the second wall member 15 with the surface 16 thereof facially juxtaposed to the surface 13 of the first wall member 11. In the illustrated embodiment, the retaining means comprises an adhesive layer 21 for securing the second wall member 15 to the first wall member 11.

As further shown in FIG. 1, the second wall member is secured to the first wall member so that at least a portion of each of the circuit pads 18 and 19 is in appositional facial registration with the touch pad 14 so as to provide a variable capacitance between the circuit pads as an incident of selective touching and nontouching of the touch pad by a user.

More specifically, as illustrated in FIG. 2, a first capacitance $C_1$ exists between circuit pad 18 and touch pad 14, and a second capacitance $C_2$ exists between circuit pad 19 and touch pad 14. When the user's finger F is disposed to touch pad 14, a third capacitance $C_T$ is provided in the circuit.

As indicated above, the dielectric wall member 15 may comprise a film of synthetic resin with the circuit pads 18 and 19 printed thereon as thin film conductive elements. Illustratively, the pads may comprise printed silver layers on the film 15. Touch pad 14 illustratively may comprise a layer of tin oxide ($SnO_2$) on surface 12 of the glass panel 11. As shown, the film 15 has a thickness substantially less than that of the wall member 11, and in the illustrated embodiment, has a thickness of approximately 7% of the thickness of glass panel 11. Illustratively, the film 15 may have a thickness of approximately 2 mils. A third dielectric wall member (not shown) may be adhesively bonded over fourth surface 17 of member 15 to electrically insulate the pad 19.

In the illustrated embodiment, the capacitance $C_2$ is approximately 90% of the capacitance $C_1$, notwithstanding the disposition of the film 15 between pad 19 and touch pad 14. As seen in FIG. 2, the dielectric adhesive 21 is disposed between each of the circuit pads and the touch pad, providing a slight increase in the total dielectric constant therebetween.

Referring to FIG. 4, a prior art construction is shown, with like members having the same number as the preferred embodiment with the addition of a suffix p. Thus, the prior art touch control has a dielectric wall member 11p having a conductive touch pad 14p on a first surface. A second dielectric wall member 15p has conductive pads 18p and 19p printed on one surface thereof and is bonded on a second surface to a second surface of first dielectric 11p by an adhesive layer 21p. A third dielectric wall member 27p is provided to electrically insulate the pads 18p and 19p.

As seen in FIG. 3, the control 10 is arranged so that pad 18 defines the input voltage connection and pad 19 defines the output voltage connection. Thus, pad 18 may be connected to a voltage source 22 by means of a conductor 23 and pad 19 may be connected to the output circuit by means of a conductor 24. As shown in FIG. 1, conductors 23 and 24 may comprise printed circuit conductors on the opposite faces of the film 15. Thus, as further shown in FIG. 1, as a result of the provision of the conductors on the opposite faces of the dielectric film so as to space the conductors as at crossover points, such as point 25, facilitated layout of the circuitry is provided.

As illustrated in FIG. 1, a plurality of cooperating touch pad and circuit pad arrangements may be provided in the control such as for use in providing suitable operator control of an appliance or the like. As further shown in FIG. 1, a ground conductor 26 may be provided between the output conductors of associated output circuit pads 19 and 19' such as conductors 24 and 24', so as to effectively minimize leakage between the output conductors. Ground conductors 26 and 26' may also extend around the input pads 18 and 18' to minimize leakage from the input circuits to the output circuits. The provision of the circuit pads on opposite surfaces of the film 15 facilitates the provision of such ground conductors as well.

The use of the opposed circuit pads on film 15 permits ease of design with improved flexibility in layout of the control panel for improved correlation with aesthetic and human factor design parameters. The arrangement further provides a substantial reduction in numbers of interconnecting conductors providing substantial economy in the manufacture of the control. The control may be substituted for conventional glass panel controls utilizing spring clip connectors.

In one illustrative example of the control 10, the glass material substrate was formed of 2.36 to 2.70 millimeters thick sodalime glass. The dielectric constant of such glass at 25° C. is 8.4 at 60 hz. and 7.9 at 1,000 hz. Tin oxide and decorative coatings were screened and fired. The backside of the glass was provided with a black coating with openings to allow for LED indicator lights to show in specified areas. The film 15 was formed of polyester resin and securely bonded to the backside of the glass on the painted black surface. The bonding was caused to be essentially free of air pockets. The dielectric strength of the polyester film was such that it could withstand 1500 volts AC RMS between surfaces without dielectric breakdown. Circuit patterns were screened on opposite sides of the polyester film. The polyester film was 0.18 millimeters thick and it was coated with silver epoxy ink to form the pads.

The foregoing disclosure of specific embodiments is illustrative of the broad inventive concepts comprehended by the invention.

I claim:
1. A capacitive touch panel comprising:
a first dielectric wall member having opposite first and second surfaces;
a conductive touch pad on said first surface;
a second dielectric wall member having opposite third and fourth surfaces;
a first conductive circuit pad on said third surface;
a second conductive circuit pad on said fourth surface, said second circuit pad being out of appositional facial registration with said first circuit pad;
electrical means connecting said first and second conductive circuit pads in an electrical circuit, said electrical connecting means including one portion adjacent said third surface and another portion adjacent said fourth surface, the disposition of said portions adjacent said opposite surfaces of the second dielectric wall member permitting crossover of said portions with the crossover portions being spaced apart by said second dielectric wall member; and
means for retaining said dielectric wall members with said third surface facially juxtaposed to said second surface and with at least a portion of each of said circuit pads in appositional facial registration with said touch pad to provide a variable capacitance between said circuit pads as an incident of selective touching and nontouching of said touch pad by a user.

2. The touch panel of claim 1 wherein said second dielectric wall member comprises a film of synthetic resin.

3. The touch panel of claim 1 wherein said second dielectric wall member has a thickness substantially smaller than that of said first wall member.

4. The touch panel of claim 1 wherein said second dielectric wall member has a thickness approximately 7% that of said first wall member.

5. The touch panel of claim 1 wherein said second wall member has a thickness of approximately 2 mils.

6. The touch panel of claim 1 wherein the capacitance between said second circuit pad and said touch pad is at least approximately 90% of the capacitance between said first circuit pad and said touch pad.

7. The touch panel of claim 1 wherein said means for retaining the dielectric wall members juxtaposed comprises adhesive means.

8. The touch panel of claim 1 wherein said means for retaining the dielectric wall members juxtaposed comprises dielectric adhesive means between said second surface of the first wall member and said third surface of the second wall member.

9. The touch panel of claim 1 wherein said circuit pads comprise thin film pads printed on said second wall member.

10. A capacitive touch panel circuit comprising:
a first dielectric wall member having opposite first and second surfaces;
a conductive touch pad on said first surface;
a second dielectric wall member having opposite third and fourth surfaces;
a first conductive circuit pad on said third surface;
a second conductive circuit pad on said fourth surface, said second circuit pad being out of appositional facial registration with said first circuit pad;
means for retaining said dielectric wall members with said third surface facially juxtaposed to said second surface and with at least a portion of each of said circuit pads in appositional facial registration with said touch pad to provide a variable capacitance between said circuit pads as an incident of selective touching and nontouching of said touch pad by a user;
first conductor means adjacent said third surface for applying an input voltage signal to said first circuit pad; and
second conductor means adjacent said fourth surface for conducting an output voltage signal from said second circuit pad, the disposition of said first and second conductor means adjacent said opposite surface permitting crossover of said conductor means with the crossover portions being spaced apart by said second dielectric wall member.

11. The capacitive touch panel circuit of claim 10 wherein said means for conducting the output voltage signal comprises conductive lead means on said second wall member.

12. The capacitive touch panel circuit of claim 10 wherein a grounded conductor is provided on said second wall member extending adjacent said means for conducting said output signal.

13. The capacitive touch panel circuit of claim 10 wherein said means for conducting the output voltage signal comprises conductive lead means on said second wall member, and a grounded conductor is provided on said second wall member extending adjacent said conductive lead.

14. The capacitive touch panel circuit of claim 10 wherein said means for conducting the output voltage signal comprises conductive lead means on said second wall member, and a grounded conductor is provided on said second wall member extending adjacent said conductive lead, each of said circuit pads and said conductive lead comprising conductive means printed on said second wall member.

15. The capacitive touch panel circuit of claim 10 wherein said means for conducting the output voltage signal comprises conductive lead means on said second wall member, and a grounded conductor is provided on said second wall member extending adjacent said conductive lead, each of said circuit pads, said grounded conductors, and said conductive lead comprising conductive means printed on said second wall member.

* * * * *